(12) United States Patent
Kumar et al.

(10) Patent No.: US 7,191,279 B2
(45) Date of Patent: Mar. 13, 2007

(54) SCHMOO RUNTIME REDUCTION AND DYNAMIC CALIBRATION BASED ON A DLL LOCK VALUE

(75) Inventors: Sathish Kumar, Bangalore (IN); Kenneth Kindsfater, Laguna Niguel, CA (US); Lionel D'Luna, Irvine, CA (US); Lakshmanan Ramakrishnan, Banglaore (IN); Anand Pande, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 537 days.

(21) Appl. No.: 10/737,358

(22) Filed: Dec. 16, 2003

(65) Prior Publication Data

US 2005/0010714 A1      Jan. 13, 2005

(51) Int. Cl.
*G06F 12/00*   (2006.01)

(52) U.S. Cl. .................. 711/105; 711/167; 711/170

(58) Field of Classification Search .................. None
See application file for complete search history.

(56) References Cited

U.S. PATENT DOCUMENTS

| | | | |
|---|---|---|---|
| 6,975,557 B2* | 12/2005 | D'Luna et al. ............. 365/233 |
| 7,023,760 B2* | 4/2006 | Hellwig ..................... 365/233 |
| 2004/0098647 A1* | 5/2004 | Pande et al. ................ 714/726 |

* cited by examiner

*Primary Examiner*—Reginald G. Bragdon
*Assistant Examiner*—Daniel Ko
(74) *Attorney, Agent, or Firm*—McAndrews, Held & Malloy, Ltd.

(57) ABSTRACT

Methods of setting numerically controlled delay lines using step sizes based on a delay locked loop lock value are presented herein. In one embodiment, a method may comprise, for example, one or more of the following: calculating an offset value for at least one NCDL; and interpolating a new offset value for the at least one NCDL, based on a change in a delay locked loop (DLL) output value from a previous DLL output value to a new DLL output value.

26 Claims, 6 Drawing Sheets

DLL and NCDL mechanism in DDR memory controller

FIG. 1: DLL and NCDL mechanism in DDR memory controller

FIG. 2: CENTER ALIGNMENT OF DQS SIGNAL AND DATA SIGNAL

FIG. 3: HARDWARE FOR SIGNAL DELAYING USING A NUMERICALLY CONTROLLED DELAY LINE

FIG. 4. METHOD FOR UPDATING AN NCDL OFFSET USING A SCALING FACTOR

FIG. 5: METHOD FOR OPTIMIZING THE SCHMOO RUNTIME ALGORITHM BY DETERMINING AN INCREMENT STEP VALUE.

SCHMOO RUNTIME REDUCTION AND DYNAMIC CALIBRATION BASED ON A DLL LOCK VALUE

RELATED APPLICATIONS

This application makes reference to, claims priority to, and claims the benefit of U.S. Provisional Patent Application No. 60/516,777, filed on Nov. 3, 2003, entitled "Setting Numerically Controlled Delay Lock Loops Using Step Sizes Based on Delay," the complete subject matter of which is hereby incorporated herein by reference, in its entirety.

This application makes reference to U.S. Provisional Patent Application 60/485,597 filed on Jul. 8, 2003, entitled "Scheme for Optimal Settings of DDR Interface," the complete subject matter of which is hereby incorporated herein by reference, in its entirety.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Signal timing is a critical aspect of high-speed digital circuit design. Reading data from memory and writing data to memory can be erroneous if control signals are not in sync with each other. In high frequency digital design, control signals can go out of sync due to different length of tracks they traverse on PCB, physical characteristics of the devices mounted on the board and changes in environment in which circuit is working.

In "Scheme for Optimal Settings for DDR Interface", U.S. application for patent application Ser. No. 60/485,597, by Kumar, et al., there is described a scheme for arriving at optimal settings for a DDR interface, based on the acquisition of statistical data to define an operating region. However, it is possible in some cases, that the NDCL offset can be quite large. If the printed circuit board skew is large enough to make the offset large, and the foregoing is not compensated, voltage and temperature changes can cause drifting away from the optimal operating point.

Additionally, if the NCDL has a large number of taps, it would increase the run-time of the algorithm. Additionally, for a Fast/Fast (FF) process with high voltage and low temperature, more NCDL taps will pass, while for a Slow/Slow (SS) process with low voltage and high temperature, fewer NCDL taps will pass.

Further limitations and disadvantages of conventional and traditional systems will become apparent to one of skill in the art through comparison of such systems with the inventions as set forth in the remainder of the present application with reference to the drawings.

BRIEF SUMMARY OF THE INVENTION

Aspects of the present invention may be found in, for example, methods of setting numerically controlled delay lines using step sizes based on a delay locked loop lock value. A method in accordance with the present invention may comprise, for example, one or more of the following: calculating an offset value for at least one NCDL; and interpolating a new offset value for the at least one NCDL, based on a change in a delay locked loop (DLL) output value from a previous DLL output value to a new DLL output value.

In another embodiment, there is an article of manufacture comprising a computer readable medium. The computer readable medium stores a plurality of instructions. Execution of the plurality of instructions causes calculating an offset value for at least one NCDL; and interpolating a new offset value for the at least one NCDL, based on a change in a delay locked loop (DLL) output value from a previous DLL output value to a new DLL output value.

These and other advantages, aspects and novel features of the present invention, as well as details of an illustrated embodiment thereof, will be more fully understood from the following description and drawings.

DETAILED DESCRIPTION OF THE INVENTION

Figure 1:
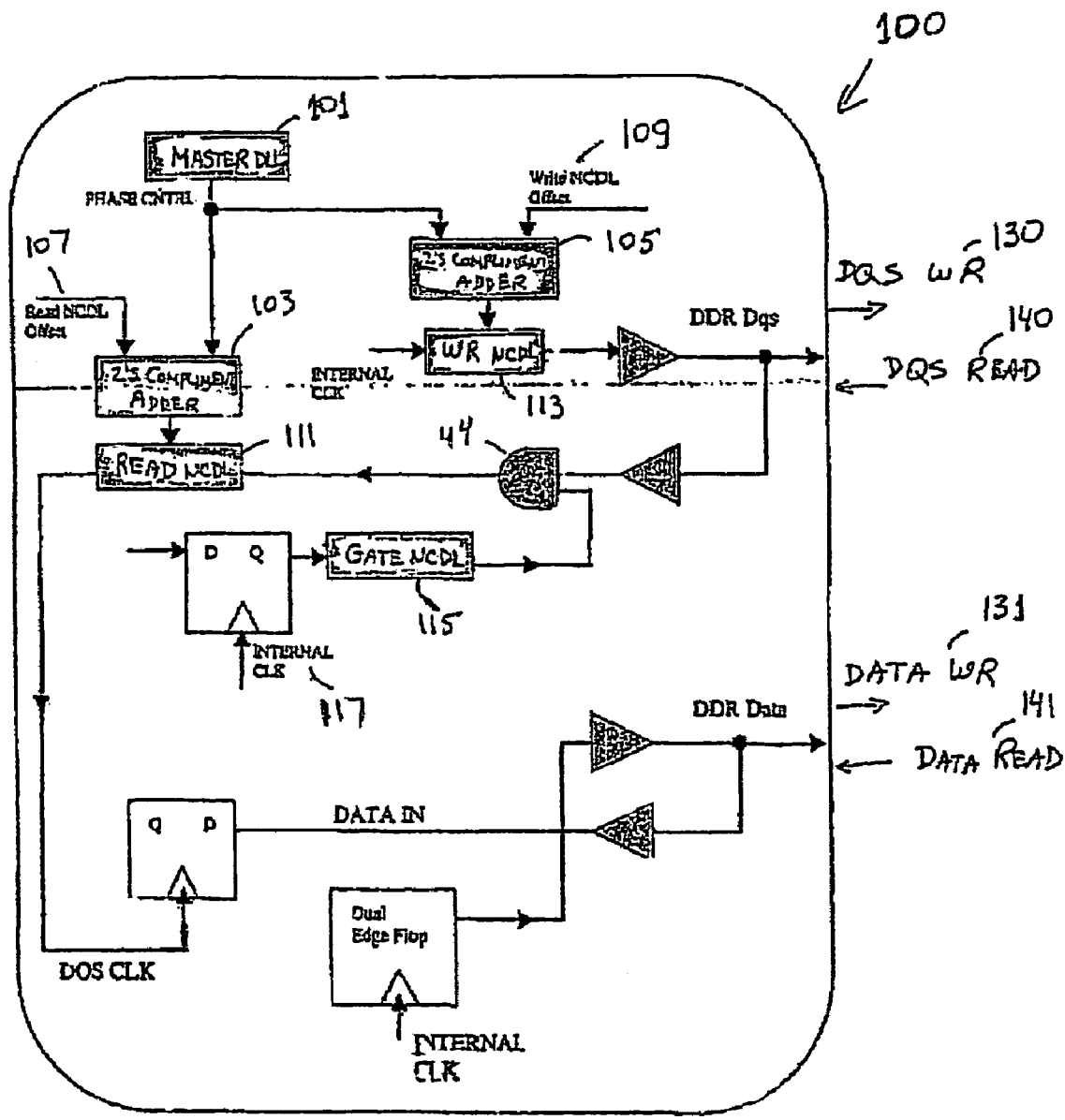
FIG. 1 is a block diagram of a DDR Memory Controller, in accordance with an embodiment of the present invention.

Referring now to FIG. 1, there is illustrated a DDR memory controller in accordance with an embodiment of the present invention. The DDR memory controller 100 comprises a master delay locked loop (DLL) 101, a read numerically controlled delay line (NCDL) 111, a write NCDL 113, a gate logic 114, a gate NCDL 115, two's compliment adders 103 and 105, a read NCDL offset 107, a write NCDL offset 109, and an internal clock 117.

A DDR-SDRAM (DDR device) is a Double Data Rate Synchronous Dynamic Random Access Memory, which receives and transfers data at both edges of the clock in order to achieve high bandwidth. In order to ensure that the data is received and transferred reliably, DDR defines a bi-directional signal called DQS (or a data strobe signal), and the timing of the data is specified with respect to the edges of this signal.

Figure 2:
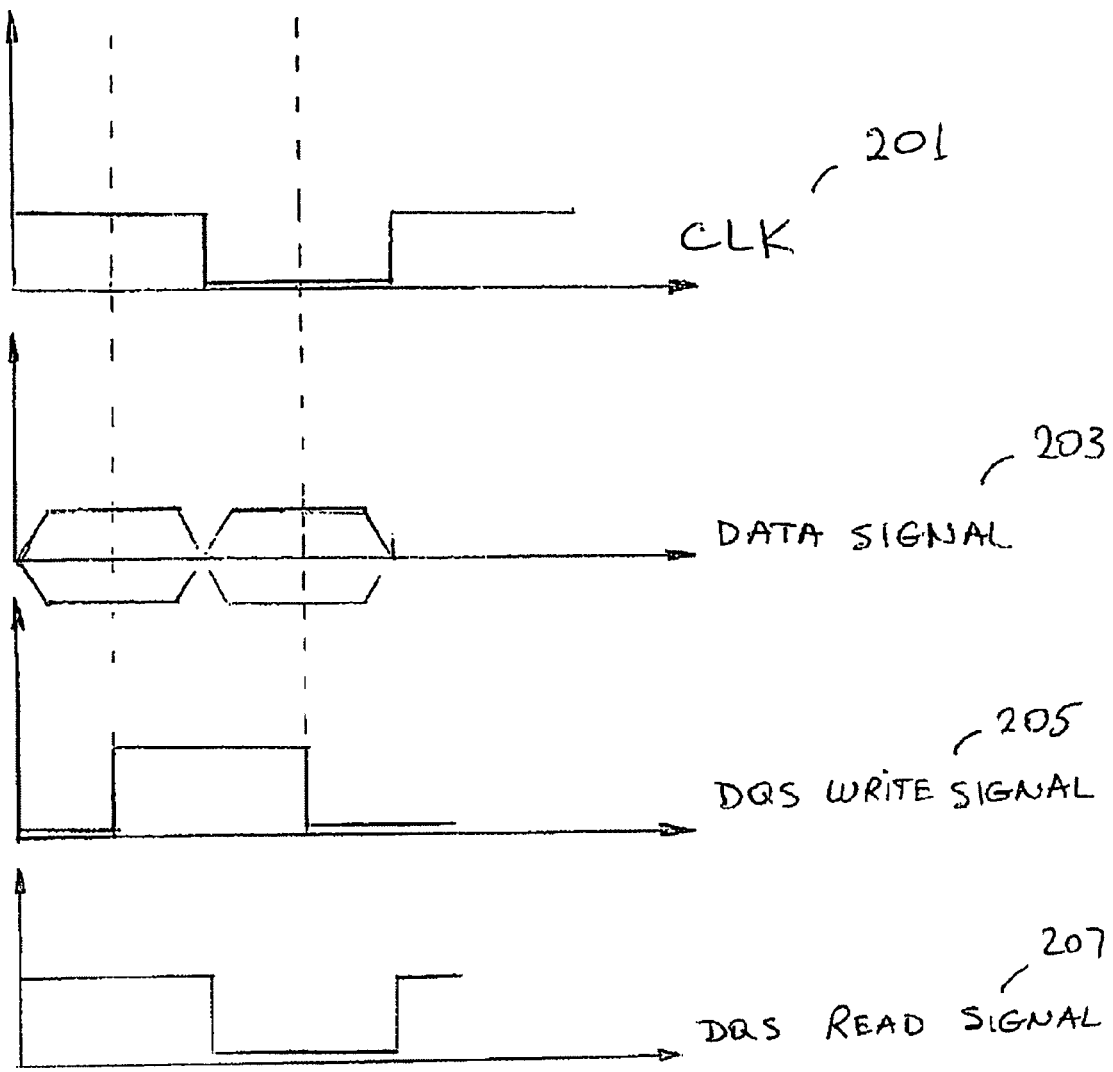
FIG. 2 is a signal plot of a center aligned DQS signal with respect to a data signal and a DDR internal clock signal, in accordance with an embodiment of the present invention.

The DQS is center aligned with respect to data during a write operation to the DDR device. Referring now to FIG. 2, there is illustrated a signal plot of a center aligned DQS write signal 205 with respect to a data signal 203. The DDR device outputs a DQS read signal 207 that is edge aligned with respect to data during the read operation. The data signal 203 is permitted to change at each rising and falling edge of the DDR internal clock signal 201. The DDR controller 100 is an agent that interfaces with the DDR device and all the components on the board access the DDR device through the DDR controller 100. During a write operation, the DDR controller is expected to center align (90-degree phase shift) the DQS with respect to the data signal, as illustrated on FIG. 2. DQS signal is tri-stated when there is no read or write operation. The noise can trigger a false read. Hence, during a read operation, the controller first validates the DQS by opening the gate signal.

Referring again to FIG. 1, the DQS read signal 140 is received with the incoming data read signal 141. The DQS read signal 140 is then validated by the controller 100 by opening the gate 114. The controller 100 then phase shifts the DQS read signal 140 towards the middle of a readable data region of the read data signal in order to reliably register the incoming data. Since the incoming DQS 140 will not be in phase with the controller's internal clock 117, gate opening is achieved by delaying the internal clock generated gate signal with the use of the gate NCDL 115.

The phase shift on the DQS signals 130 and 140 is achieved by using a numerically controlled delay line (NCDL), whose numerical input is generated by a delay locked loop (DLL). This setup ensures that the phase shift obtained tracks Process-Voltage-Temperature (PVT) variation. However, because of board skews, the phase shift obtained from the DLL might not exactly produce a 90 degrees phase shift on the DQS path. An embodiment of the present invention allows for an offset of the numerical value produced by the DLL in order to achieve optimum setting for the DDR controller 100. It also allows for the gate opening 14 to be fixed at an optimal point allowing reliable operation across PVT variations.

The DDR controller 100 has three NCDLs—a gate NCDL 115, a read NCDL 111, and a write NCDL 113. The read NCDL 111 is used to phase shift the DQS read signal 140 with respect to the data read signal 141 when data is read from the DDR device. The write NCDL 113 is used to phase shift the DQS write signal 130 with respect to the data write signal 131 when data is written to the DDR device connected to the DDR controller 100. The gate NCDL 115 allows for an optimization of opening the gate logic 114 for the incoming DQS read signal 140 during a read operation.

The master DLL 101 outputs a number that, when programmed in an NCDL, would produce a 90-degree phase shift in the signal passing through it. Since similar NCDLs, as in the DLL, are being used as the read NCDL 111 and the write NCDL 113, the numerical value from the master DLL 101 produces the same 90-degree phase shift for the read NCDL 111 and the write NCDL 113. However, to compensate for the board skews, a programmable offset is added to the numerical output of the master DLL 101. The read and write NCDLs have separate programmable offset registers, providing a read NCDL offset value 107 and a write NCDL offset value 109. The output from the master DLL 101 and the two offset values, 107 and 109, are fed into two's compliment adders 103 and 105. The values that get programmed into the read NCDL 111 and the write NCDL 113 are the two's compliment additions of the DLL output value and the respective NCDL offsets 107 and 109. However, the gate NCDL 115, that is used to delay signal entering the gate logic 114, is programmed with an absolute value.

In accordance with an embodiment of the present invention, a software program tests all the possible combinations of the write NCDL offset 109, the read NCDL offset 107, and the gate NCDL 115 under stressful condition. The software then programs NCDL registers of the DDR memory controller 100 optimally, bringing sync relationship of 90-degree phase-shift between a DQS signal and a data signal. Even though offset is programmed into the read and write NCDLs, here onwards these programming values will be referred to as read NCDL and write NCDL. The range of NCDL values, for which the DDR memory controller 100 works reliably defines an operating region for the DDR memory controller. The optimal working point may then be calculated using the operating region.

Figure 3:
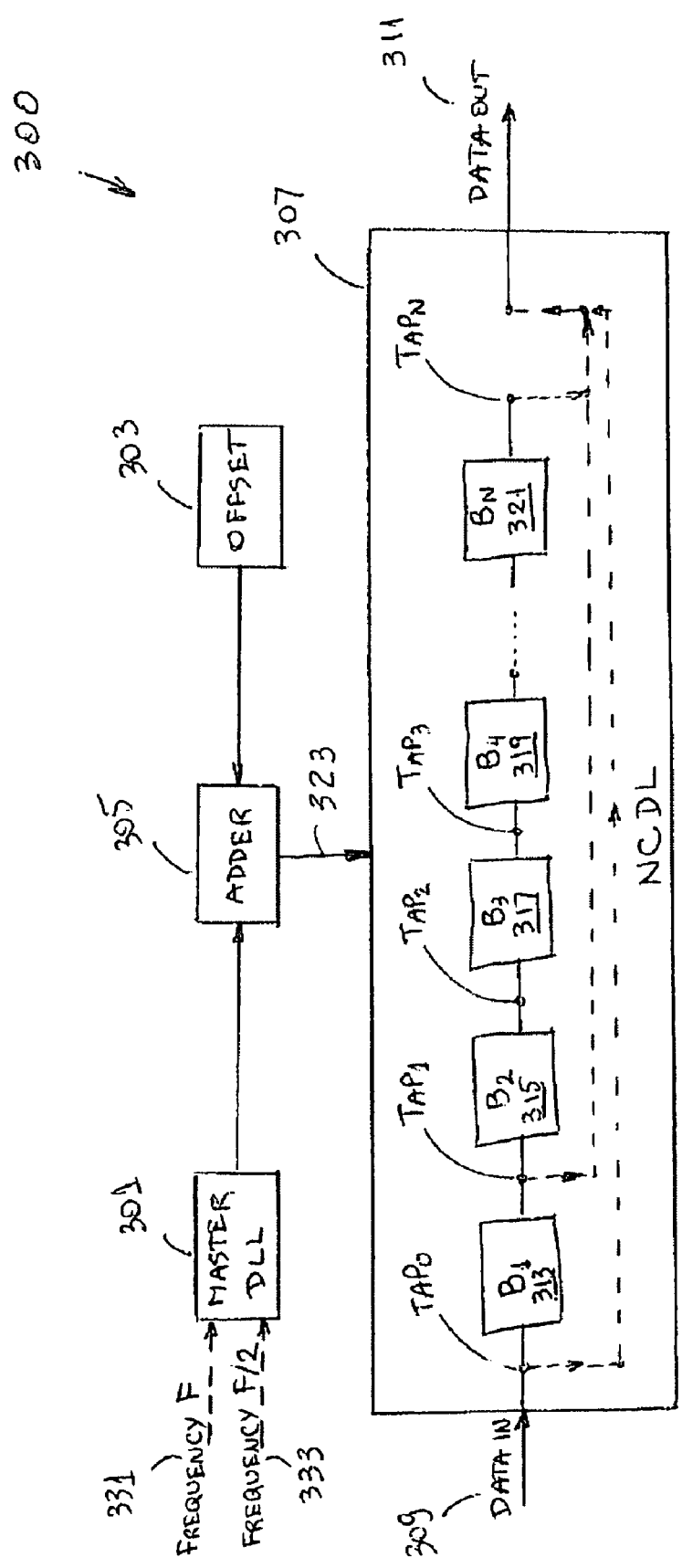
FIG. 3 is a blocked diagram of hardware for signal delaying using a numerically controlled delay line, in accordance with an embodiment of the present invention.

Referring now to FIG. 3, there is illustrated a blocked diagram of hardware 300 for signal delaying using a numerically controlled delay line, in accordance with an embodiment of the present invention. The numerically controlled delay line (NCDL) 307 is a piece of hardware that delays the incoming data 309 to obtain a delayed outgoing data 311. The NCDL 307 comprises a chain of buffers, $B_1$ through $B_n$, each of the buffers producing a given delay, for example 10 ns. An incoming signal 309 may be tapped after the first buffer $B_1$, 313, thus producing a total delay of 10 ns in the outgoing data signal 311. Similarly, the delay produced by tapping the incoming signal 309 at $Tap_2$ after buffer $B_2$, 315, is 20 ns, at $Tap_3$ after buffer $B_3$, 317, is 30 ns, etc. If the incoming signal 309 is tapped at the zeroth tap $Tap_0$, theoretically there is no delay in the outgoing signal 311. However, in practice, there is always an internal signal delay on the incoming signal prior to going through buffer $B_1$. This internal signal delay is negligible and is of the order of one tap of a delay, i.e., the delay produced by each of the NCDL buffers.

The amount of delay produced by the NCDL 307 is proportional to a value set at the phase control input 323 of the NCDL. The higher this NCDL value, the more taps the incoming signal 309 has to go through, and the higher the resulting signal delay of the outgoing signal 311.

The master delay locked loop (DLL) 301 is a piece of hardware that uses similar NCDLs to phase lock the input and output clock and provide a DLL output value. There is a particular tap used in the NCDLs inside of the DLL 301 so that the DLL output value provides a fixed tap, that when used on another NCDL on the DDR memory controller, the resulting NCDL delay is exactly 90 degrees, resulting in a phase shift of 90 degrees. If the operating conditions of the DDR controller change, i.e. process-volt-temperature (PVT) conditions change, the DLL 301 changes the DLL output value so that the resulting NCDL delay is kept at a constant 90 degrees when the DLL output is used by the NCDL. For example, a DLL value provided by the Master DLL 301 should provide a 90-degree phase shift of the outgoing data 311 with respect to the incoming data 309 when entered in the NCDL 307.

The data output 311 of the NCDL 307 is always 90-degree phase shifted with respect to the data input 309. However, because of board skews and different PVT conditions, the output of the NCDL 307 may not place the edges of the DQS write signal, or the DQS read signal, center-aligned, or edge-aligned, with the data signal window. By running an algorithm, such as a Schmoo algorithm, an adjusting NCDL offset 303 is calculated in order to accomplish correct DQS signal alignment. The offset 303 is combined with the DLL output of the master DLL 301 in an adder 305. The resulting value is entered in the NCDL 307 at the phase control input 323. The optimizing NCDL offset is not locked to anything, and it is calculated using the aforementioned algorithm only when the chip is initially powered. However, as operating conditions change, such as VT, the initially calculated NCDL offset may not be optimal anymore. For example, it is possible in some cases, that the NDCL offset can be quite large. If the printed circuit board skew is large enough to make the offset large, and the foregoing is not compensated, voltage and temperature changes can cause drifting away from the optimal operating point. Additionally, if the NCDL has a large number of taps, it would increase the run-time of the algorithm. For a Fast/Fast (FF) process with high voltage and low temperature, more NCDL taps will pass the data window, while for a Slow/Slow (SS) process with low voltage and high temperature, fewer NCDL taps will pass the data window. Therefore, the NCDL offset produced at the initial powering of the chip may need to be continuously updated as the operating conditions change.

Since the operating conditions may change, the DLL output value for the master DLL 301 may be checked periodically and if it is different from the initial DLL output value, then the NCDL offset may also be adjusted. Under varying operating conditions the DLL output of the master DLL 301 will automatically change in order to ensure a constant 90-degree phase shift in the NCDL 307. The NCDL offset may then be changed as well.

Figure 4:
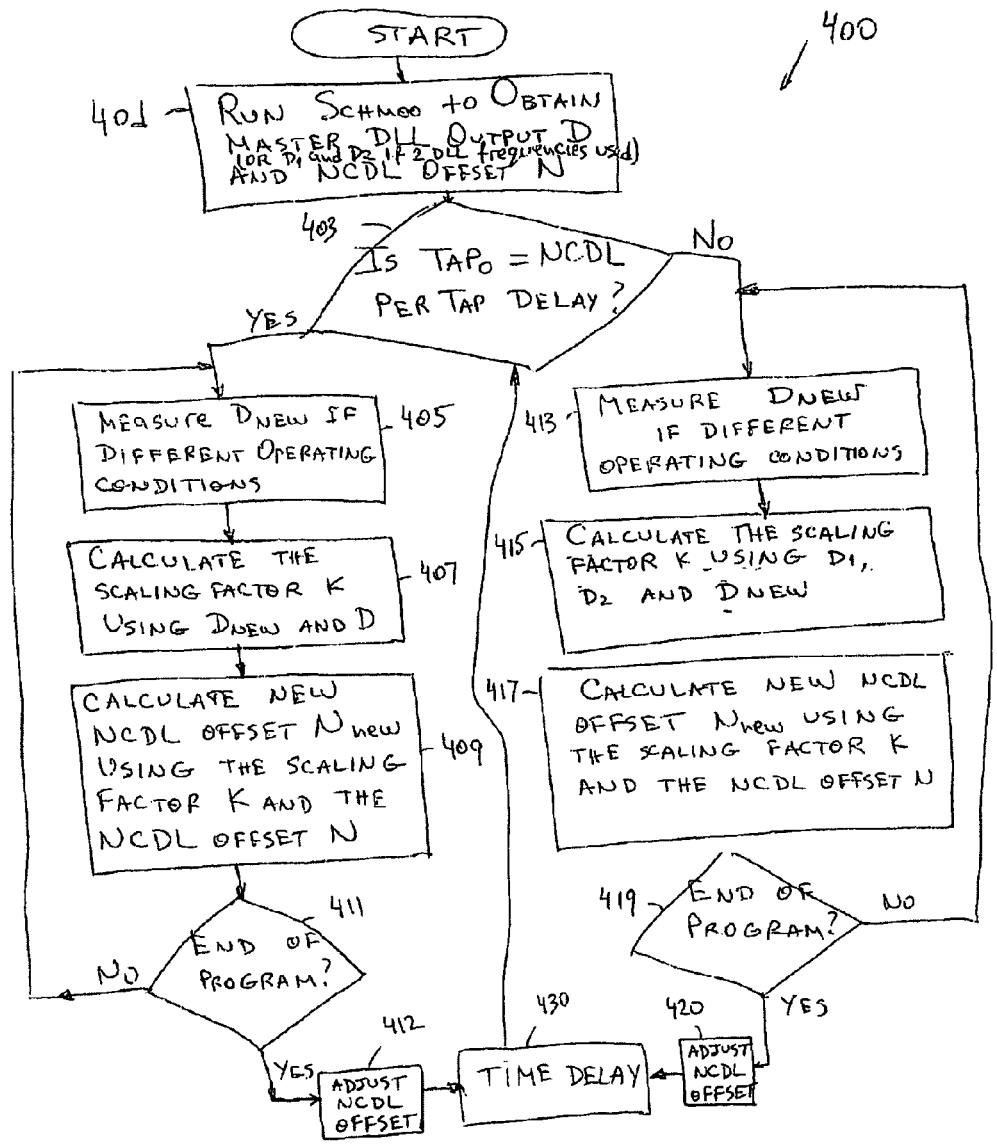
FIG. 4 is a flowchart illustrating an embodiment of a method for updating an NCDL offset using a scaling factor, in accordance with an embodiment of the present invention.

Referring now to FIG. 4, there is illustrated a flowchart of an embodiment of a method 400 for updating an NCDL offset using a scaling factor, in accordance with an embodiment of the present invention. At 401, an algorithm, such as the algorithm described in U.S. Provisional Patent Application 60/485,597, is run in order to obtain an initial optimal values N for the NCDL tap offset, and a value D for the DLL output value. The method 400 may be applied, for example, to a read NCDL, a write NCDL, or a gate NCDL.

At query 403 it is determined whether the zeroth tap delay $Tap_0$ equals the per tap delay of the NCDL. A software program can simply do a linear interpolation for an updated value of $N_{new}$, based on the change in the value D.

If the zeroth tap delay $Tap_0$ equals the per tap delay of the NCDL, then a new value of D, $D_{new}$, may be measured if the operating conditions have changed. For example, for a frequency of 100 MHz (i.e., clk_prd=10 ns), the following values may be obtained by using the aforementioned algorithm after the chip is initially powered:

D=10 taps

N=5 taps

Since D provides a 90-degree phase shift, D provides a 2.5 ns delay and N provides a 1.25 ns delay. As the temperature and voltage changes, the DLL output may change to, for example, D=20 taps (as the DLL tracks the V & T, the P being fixed for a given chip). Based on this, the per tap delay of NCDL (inside DLL) has changed to 0.125 ns (2.5 ns/20 taps) from 0.25 ns (2.5 ns/10 taps). Realizing that the PCB delays are mostly VT invariant, it is preferred for N to continue to give 1.25 ns delay offset. Thus, based on the new per tap delay of the NCDL, the following may be recalculated, N=1.25 ns/0.125 ns=>10 taps. A scaling factor K is calculated at 407, using the equation $K=D_{new}/D$. A new NCDL offset $N_{new}$ is calculated at 409, using the scaling factor K and the initial NCDL offset N in the equation $N_{new}=K*N$. At query 411 it is determined whether an end of program has been reached. If yes, then the NCDL offset register is updated at 412 and the program performs a time delay 430 until it is time to execute 403 again. If there is no end of program, an updated $N_{new}$ may be calculated by restarting the update cycle at 405.

On the other-hand, if the NCDL zeroth tap is not equal to the NCDL per tap delay, two output values of D1 and D2 may be calculated for the master DLL. Referring again to FIG. 3, an original frequency F, 331, may be entered through the master DLL 301. The resulting DLL output is D1. In order to obtain a second DLL output D2, a half frequency F/2, 333, may also be entered through the master DLL 301. The test frequency 333 may be selected by simply having a divide by two/toggle flop circuit and a multiplexer at the input of the master DLL 301 in order to select between the half frequency F/2, 333, and the original frequency F, 331. Both D1, the original frequency DLL output, and D2, the half frequency DLL output, fetch a 90-degree phase shift for their input frequency.

Referring again to FIG. 4, the scaling factor K is calculated at 415, as follows:

$$Z+D2*d =2*(Z+D1*d) \text{ (as the period during } D2=2* \text{ period during } D1\text{)}$$

$$Z=(D2-2D1)*d,$$

where Z=zeroth tap delay of the NCDL, and d=per tap delay of the NCDL.

Now, let us approximate that the zeroth tap delay of the NCDL and the per tap delay of the NCDL, both scale by the same factor K with V/T. Also let $D_{new}$ be the new DLL output for a different V/T. Then, $$Z_{new}+D_{new}*d_{new}=Z+D1*d$$

$$K*Z+K*d*D_{new}=Z+D1*d$$

$$K=(Z+D1*d)/(Z+D_{new}*d)$$

$$K=(D2-D1)/(D2-2D1+D_{new})$$

The new NCDL offset $N_{new}$ is calculated at 417 using the equation $N_{new}=K*N$. The above method 400 may be implemented, for example, by software. At query 419 it is determined whether an end of program has been reached. If yes, then the NCDL offset register is updated at 420 and the program performs a time delay 430 until it is time to execute 403 again. If there is no end of program, an updated $N_{new}$ may be calculated by restarting the update cycle at 413.

Figure 5:
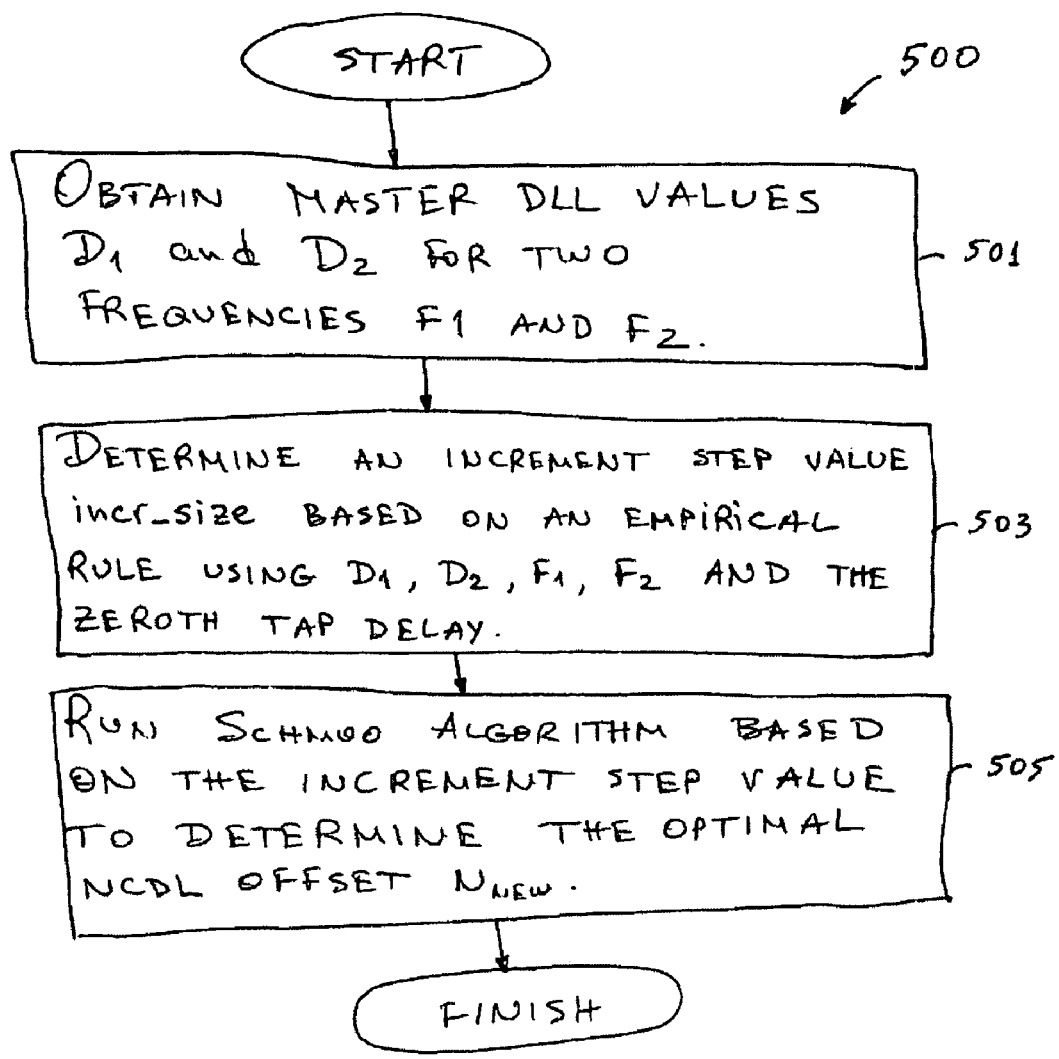
FIG. 5 is a flowchart illustrating an embodiment of a method for optimizing the Schmoo runtime algorithm by determining an increment step value, in accordance with an embodiment of the present invention.

Alternatively, the range of the NCDL's can be scanned using step sizes that are based on, or are a function of, the DLL lock value and the corresponding passing window of a given signal. Based on the same, an increment step size can be selected—higher for a higher lock value, and lower for a lower lock value. Referring now to FIG. 5, there is a flowchart of an embodiment of a method 500 for optimizing the Schmoo runtime algorithm by determining an increment step value, in accordance with an embodiment of the present invention. At 501, master DLL output values D1 and D2, corresponding to two test frequencies, are obtained. The test frequencies may be, for example, an original frequency F and a half frequency F/2.

At 503, an increment step value, incr_size, is determined based on an empirical rule using D1, D2, the two frequencies (F and F/2 for example), and the zeroth tap delay value Z. The empirical calculations may be performed in the following way:

In order to minimize the Schmoo runtime, a delay interval, dss, that is equal to the per tap delay of the NCDL in a Slow/Slow corner may be utilized to step through the NCDL, i.e., P=max, V=min, and T=max. The value dss may be calculated, for example, by a theoretical analysis of the library used in building the NCDL.

The zeroth tap delay value Z, and the DLL tap values D1 and D2 for frequencies F and F/2, may be utilized in the following equations in order to determine a value for d:

$$Z+D2*d=(2/F)/4$$

$$Z+D1*d=(F/4)$$

The increment step value would be incr_size=[dss/d] (floor function).

After the increment step value is determined in 503, the Schmoo algorithm is utilized, in 505, based on the calculated increment step value in order to determine an optimal NCDL offset $N_{new}$ if the DLL output has changed from D to $D_{new}$.

Figure 6:
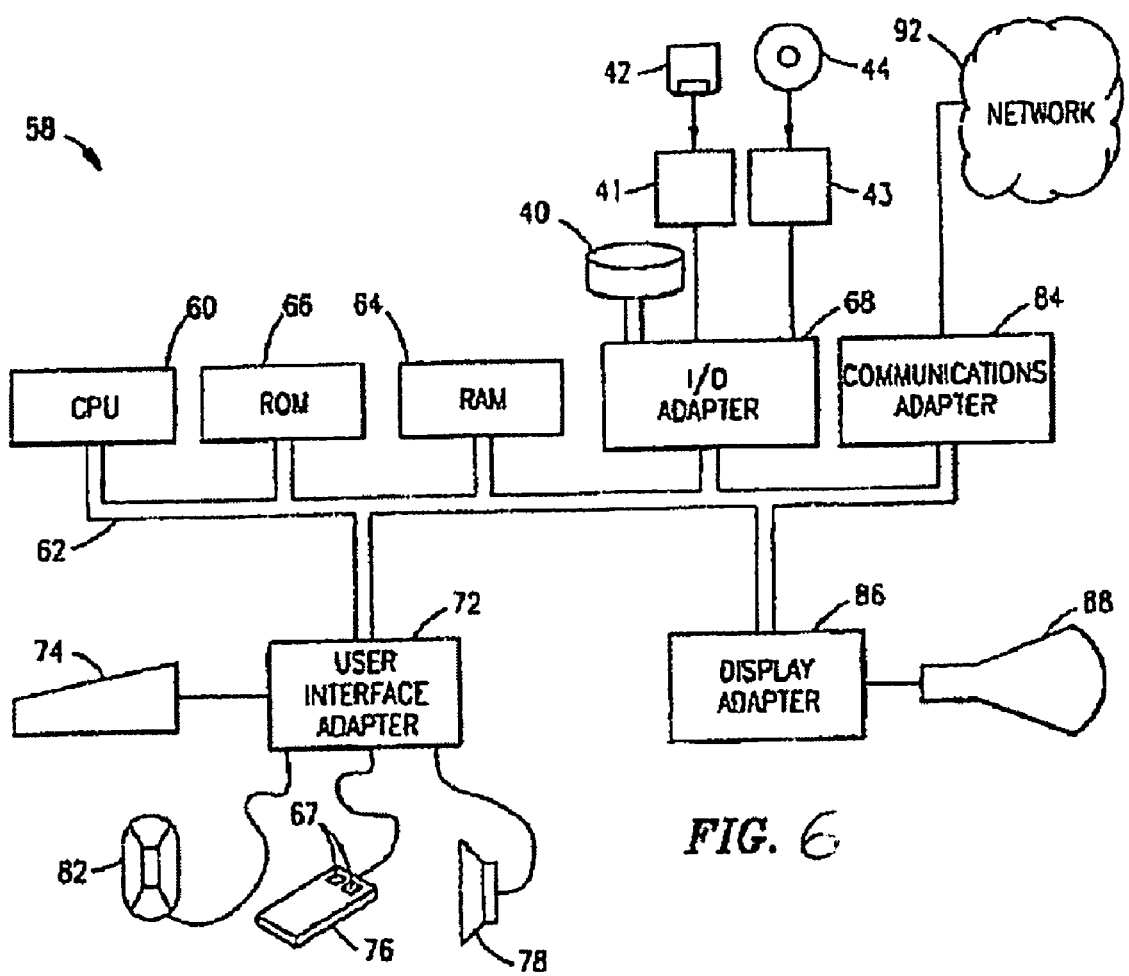
FIG. 6 is an exemplary hardware environment, wherein the present invention may be practiced.

Referring now to FIG. 6, a representative hardware environment for a computer system 58 for practicing the present invention is depicted. A CPU 60 is interconnected via system bus 62 to random access memory (RAM) 64, read only memory (ROM) 66, an input/output (I/O) adapter 68, a user interface adapter 72, a communications adapter 84, and a display adapter 86. The input/output (I/O) adapter 68 connects peripheral devices such as hard disc drives 40, floppy disc drives 41 for reading removable floppy discs 42, and optical disc drives 43 for reading removable optical disc 44 (such as a compact disc or a digital versatile disc) to the bus 62. The user interface adapter 72 connects devices such as a keyboard 74, a mouse 76 having a plurality of buttons 67, a speaker 78, a microphone 82, and/or other user interfaces devices such as a touch screen device (not shown) to the bus 62. The communications adapter 84 connects the computer system to a data processing network 92. The display adapter 86 connects a monitor 88 to the bus 62.

An embodiment of the present invention can be implemented as a file resident in the random access memory 64 of one or more computer systems 58 configured generally as described in FIG. 6. Until required by the computer system 58, the file may be stored in another computer readable memory, for example in a hard disc drive 40, or in removable memory such as an optical disc 44 for eventual use in an optical disc drive 43, or a floppy disc 42 for eventual use in a floppy disc drive 41. The file can contain a plurality of instructions executable by the computer system, causing the computer system to perform various tasks, such effectuating the flow charts described in FIG. 4 and FIG. 5.

One skilled in the art would appreciate that the physical storage of the sets of instructions physically changes the medium upon which it is stored electrically, magnetically, or chemically so that the medium carries computer readable information.

While the invention has been described with reference to certain embodiments, it will be understood by those skilled in the art that various changes may be made and equivalents may be substituted without departing from the scope of the invention. In addition, many modifications may be made to adapt particular situation or material to the teachings of the invention without departing from its scope. Therefore, it is intended that the invention not be limited to the particular embodiment(s) disclosed, but that the invention will include all embodiments falling within the scope of the appended claims.

What is claimed is:

1. A method for optimizing at least one numerically controlled delay line (NCDL) in a double data rate (DDR) memory controller, the method comprising:
   (a) calculating an offset value for at least one NCDL; and
   (b) interpolating a new offset value for the at least one NCDL, based on a change in a delay locked loop (DLL) output value from a previous DLL output value to a new DLL output value.

2. The method of claim 1, wherein the at least one NCDL comprises at least one of a write NCDL, a read NCDL, and a gate NCDL.

3. The method of claim 1, wherein the offset value comprises a final write NCDL offset.

4. The method of claim 1, wherein the offset value comprises a final read NCDL offset.

5. The method of claim 1, wherein the offset value comprises a final gate NCDL offset.

6. The method of claim 1, wherein the interpolating of the new offset value comprises:
   interpolating a scaling factor, wherein the scaling factor is a function of the previous DLL output value and the new DLL output value.

7. The method of claim 6, wherein the interpolated new offset value is a function of at least one of the scaling factor and the offset value.

8. The method of claim 1, wherein the previous DLL output value comprises at least one of an original frequency DLL output value and a test frequency DLL output value.

9. The method of claim 8, wherein the interpolating of the new offset value comprises:
   interpolating a scaling factor, wherein the scaling factor is a function of the previous DLL output value and the new DLL output value.

10. The method of claim 9, wherein the interpolated new offset value is a function of at least one of the scaling factor and the offset value.

11. The method of claim 1, wherein the interpolating comprises:
    deriving an empirical rule, based on at least one of the new DLL output value and a passing window size of a signal;
    selecting a step size, based on the empirical rule; and
    selecting a new offset value by adjusting a range of values for the at least one NCDL using the selected step size.

12. The method of claim 1, wherein the change in the DLL output value is caused by a change in an operating condition of the DDR memory controller.

13. The method of claim 1, further comprising:
    (c) repeating (b) upon a change in an operating condition of the DDR controller.

14. A computer readable media storing a plurality of instructions, wherein execution of the plurality of instructions causes:
    (a) calculating an offset value for at least one numerically controlled delay line (NCDL); and
    (b) interpolating a new offset value for the at least one NCDL, based on a change in a delay locked loop (DLL) output value from a previous DLL output value to a new DLL output value.

15. The computer readable media of claim 14, wherein the at least one NCDL comprises at least one of a write NCDL, a read NCDL, and a gate NCDL.

16. The computer readable media of claim 14, wherein the offset value comprises a final write NCDL offset.

17. The computer readable media of claim 14, wherein the offset value comprises a final read NCDL offset.

18. The computer readable media of claim 14, wherein the offset value comprises a final gate NCDL offset.

19. The computer readable media of claim 14, wherein the interpolating of the new offset value comprises:
    interpolating a scaling factor, wherein the scaling factor is a function of the previous DLL output value and the new DLL output value.

20. The computer readable media of claim 19, wherein the interpolated new offset value is a function of at least one of the scaling factor and the offset value.

21. The computer readable media of claim 14, wherein the previous DLL output value comprises at least one of an original frequency DLL output value and a test frequency DLL output value.

22. The computer readable media of claim 21, wherein the interpolating of the new offset value comprises:

interpolating a scaling factor, wherein the scaling factor is a function of the previous DLL output value and the new DLL output value.

23. The computer readable media of claim 22, wherein the interpolated new offset value is a function of at least one of the scaling factor and the offset value.

24. The computer readable media of claim 14, wherein the interpolating comprises:
    deriving an empirical rule, based on at least one of the new DLL output value and a passing window size of a signal;
    selecting a step size, based on the empirical rule; and
    selecting a new offset value by adjusting a range of values for the at least one NCDL using the selected step size.

25. The computer readable media of claim 14, wherein the change in the DLL output value is caused by a change in an operating condition of the double data rate (DDR) memory controller.

26. The computer readable media of claim 14, further comprising:
    (c) repeating (b) upon a change in an operating condition of the DDR controller.

* * * * *